(12) United States Patent
Han et al.

(10) Patent No.: US 9,305,124 B2
(45) Date of Patent: Apr. 5, 2016

(54) METHODS FOR INTEGRATED CIRCUIT ANALYSIS

(75) Inventors: Youngae Han, San Jose, CA (US); Jinsong Zhao, Palo Alto, CA (US)

(73) Assignee: Lorentz Solution, Inc., Santa Clara, CA (US)

(*) Notice: Subject to any disclaimer, the term of this patent is extended or adjusted under 35 U.S.C. 154(b) by 508 days.

(21) Appl. No.: 13/451,504

(22) Filed: Apr. 19, 2012

(65) Prior Publication Data

US 2012/0271602 A1    Oct. 25, 2012

Related U.S. Application Data

(60) Provisional application No. 61/477,145, filed on Apr. 19, 2011.

(51) Int. Cl.
*G06F 17/50* (2006.01)

(52) U.S. Cl.
CPC ........ *G06F 17/5018* (2013.01); *G06F 17/5036* (2013.01)

(58) Field of Classification Search
USPC .......................................................... 703/14
See application file for complete search history.

(56) References Cited

U.S. PATENT DOCUMENTS

| | | | |
|---|---|---|---|
| 7,562,000 B2* | 7/2009 | Zhao | 703/14 |
| 2003/0055586 A1* | 3/2003 | Mills, Jr. | 702/65 |
| 2007/0245275 A1* | 10/2007 | Jandhyala et al. | 716/4 |
| 2009/0015586 A1* | 1/2009 | Im et al. | 345/423 |
| 2010/0094609 A1* | 4/2010 | Han et al. | 703/14 |
| 2010/0194261 A1* | 8/2010 | Sakano | 313/325 |
| 2010/0217576 A1* | 8/2010 | Bharath et al. | 703/14 |
| 2010/0218145 A1* | 8/2010 | Engin et al. | 716/3 |

OTHER PUBLICATIONS

W. Cai et al., "High-Order Mixed RWG Basis Functions for Electromagnetic Applications," IEEE Transactions on Microwave Theory and Techniques, vol. 49, No. 7, Jul. 2001, pp. 1295-1303.*

Y. Han and J. Zhao, "Accurate Substrate Analysis Based on a Novel Finite Difference Method via Synchronization Method on Layered and Adaptive Meshing," IEEE Transactions on Computer-Aided Design of Integrated Circuits and Systems, vol. 32, No. 10, Oct. 2013, pp. 1520-1532.*

K. Bharath et al., "Use of the Finite Element Method for the Modeling of Multi-Layered Power/Ground Planes with Small Features," 2009 Electronic Components and Technology Conference, pp. 1630-1635.*

V. Jandhyala et al., "Coupled Electromagnetic-Circuit Simulation of Arbitrarily-Shaped Conducting Structures using Triangular Meshes," Proceedings of the International Symposium on Quality Electronic Design (ISQED'02), IEEE Computer Society, 2002.*

F. Ling et al., "Efficient Electromagnetic Modeling of Microstrip Structures in Multilayer Media," IEEE Transactions on Microwave Theory and Techniques, vol. 47, No. 9, Sep. 1999, pp. 1810-1818.*

(Continued)

*Primary Examiner* — Saif Alhija
*Assistant Examiner* — Cuong Luu
(74) *Attorney, Agent, or Firm* — Venture Pacific Law, PC

(57) ABSTRACT

A simulation method for simulating a three-dimensional structure, comprises the steps of: discretizing the three-dimensional structure into two-dimensional ("2-D") layers; constructing a two-dimensional basis for each of the 2-D layers; and constructing a one-dimensional finite difference basis between the 2-D layers.

19 Claims, 15 Drawing Sheets

(56) References Cited

OTHER PUBLICATIONS

J. Cerdà, "Tutorial—The Finite Difference and Finite element methods," Dec. 9, 2009, ICP, Stuttgart.*

K. Wu et al., "Delaunay-Voronoi Modeling of Power-Ground Planes With Source Port Correction," IEEE Transactions on Advanced Packaging, vol. 31, No. 2, May 2008, pp. 303-310.*

E. Liu et al., "Novel Methods for Modeling of Multiple Vias in Multilayered Parallel-Plate Structures," IEEE Transactions on Microwave Theory and Techniques, vol. 57, No. 7, Jul. 2009, pp. 1724-1733.*

B. Wu and L. Tsang, "Full-Wave Modeling of Multiple Vias Using Differential Signaling and Shared Antipad in Multilayered High Speed Vertical Inter-Connects," Progress in Electromagnetics Research, PIER 97, 129-139, 2009.*

M. Sadiku, "A Simple Introduction to Finite Element Analysis of Electromagnetic Problems," IEEE Transactions on Education, vol. 32, No. 2, May 1989, pp. 85-93.*

Hu Mengna Enhanced PEEC Electromagnetic Modeling for RF/Microwave Multi-layer Circuits Thesis, Chinese University of Hong Kong, 2004.*

M.I. Aksun, "A robust approach for the derivation of closed-form Green's functions", in IEEE Trans. Microwave Theory Tech. vol. 44, pp. 651-658, May 1996, USA.

M.I. Aksun, G. Dural, "Clarification of Issues on Closed-Form Green's Functions in Stratified Media", in IEEE Transactions on Antennas and Propagation, pp. 3644-3653, Nov. 2005, USA.

M.C. Chou, "Fast Algorithms for ill-Conditioned Dense-Matrix Problems in VLSI Interconnect and Substrate Modeling", PhD dissertation, MIT, 1998, USA.

R. Gharpurey, "Modeling and Analysis of Substrate Coupling in Integrated Circuits", PhD dissertation, Univ. California at Berkeley, 1995, USA.

R. Gharpurey and R.G. Meyer, "Modeling and Analysis of Substrate Coupling in Integrated Circuits", in IEEE J. Solid-State Circuits, vol. 31, No. 3, pp. 344-353, Mar. 1996, USA.

X. Hu, "Full-wave Analysis of Large Conductor Systems over Substrate", PhD dissertation, MIT, 2005, USA.

T.A. Johnson, R.W. Knepper, V. Marcello, and W. Wang, "Chip substrate resistance modeling technique for integrated circuit design", in IEEE Transactions On Computer-Aided Design, vol. CAD-3, No. 2, pp. 126-134, Apr. 1984, USA.

K.J. Kerns, I.L. Wemple and A.T. Yang, "Stable and efficient reduction of substrate model networks using congruence transforms", in ICCAD, 1995, USA.

S. Kumashiro, R.A. Rohrer, and A.J. Strojwas, "A new efficient method for the transient simulation of three-dimensional interconnectstructures", in Proceedings of the IEEE International Electron Devices Meeting, pp. 193-196, 1990, USA.

Krzysztof A. Michalski and Juan R. Mosig, "Multilayered Media Green's Functions in Integral Equation Formulations", in IEEE Trans. Antennas and propag., vol. 45, No. 3, pp. 508-519, Mar. 1997, USA.

A.M. Niknejad, R. Gharpurey, and R.G. Meyer, "Numerically stable Green function for modeling and analysis of substrate coupling in integrated circuits," in IEEE Trans. CAD, vol. 17, pp. 305-315, 1989, USA.

A.C. Polycarpou, P.A. Tirkas and C.A. Balanis, "The finite-element method for modeling circuits and interconnects for electronic packaging", in IEEE Trans. on Microwave Theory and Techniq., vol. 45, No. 10, pp. 1868-1874, Oct. 1997, USA.

A.E. Ruehli, "Equivalent Circuit Models for Three-Dimensional Multiconductor Systems", in IEEE Trans. Microwave theory and tech., vol. MTT-22, No. 3, Mar. 1974, USA.

S.M. Rao, D.R. Wilton, and A.W. Glisson, "Electromagnetic scattering by surface of arbitrary shape", in IEEE Trans. Antennas and propag., vol. AP-30, pp. 49-418, May 1982, USA.

Schrik, E. and Van Der Meijs, N.R., "Combined BEM/FEM substrate resistance modeling", in DAC, 2002, proc. 39, USA.

T. Smedes, N.P. Van Der Meijs, and A.J. Van Genderen, "Boundary element methods for 3D capacitance and substrate resistance calculations in inhomogeneous media in a VLSI layout verification package," in Advances Eng. Software, vol. 20, No. 1, pp. 19-27, 1994, USA.

D.R. Wilton, S.M. Rao, A.W. Glisson, D.H. Schaubert, O.M. Al-Bundak and C.M. Butler, "Potential Integrals for Uniform and Linear Source Distribution on Polygon and Polyhedral Domains", in IEEE Trans. Antennas and propag., vol. AP-32, pp. 276-281, Mar. 1984, USA.

J. Zhao, W.M. Dai, S. Kapur and D.E. Long, "Efficient three-dimensional extraction based on static and full-wave layered Green's functions", proceedings of the 35th annual Design Automation Conference (DAC), pp. 224-229, 1998, USA.

* cited by examiner

METHODS FOR INTEGRATED CIRCUIT ANALYSIS

CROSS REFERENCE

This application claims priority from a provisional patent application entitled "Accurate substrate analysis based on layered meshing with a novel correction method for numerical efficiency" filed on Apr. 19, 2011 and having an Application No. 61/477,145. Said application is incorporated herein by reference.

FIELD OF INVENTION

This invention generally relates to methods for integrated circuit analysis and, in particular, to methods for modeling electromagnetic circuits.

BACKGROUND

The effective resistance of a resistive mesh is a commonly used analogy for various scientific and engineering problems such as voltage drop estimation, substrate coupled noise, distributed control including time synchronization and sensor localization, determining the chemical distance among multiple bonds, and finding the distance between two vertices in a graph. Furthermore, resistive mesh networks are a commonly used structure in electronics to model different elements of an integrated circuit, such as a physical substrate, an integrated circuit layout, and a power distribution network. In particular, for an integrated circuit ("IC"), the electromagnetic interactions above the substrate can be described in a full-wave partial element equivalent circuit ("PEEC") fashion. However, detailed analysis of the substrate structures, including substrate contacts, guard rings, diffusion layers, and other non-uniform materials, require three-dimensional ("3-D") simulations of the substrate to achieve the required accuracy.

Due to their versatility, the finite difference method ("FDM"), the finite element method ("FEM"), and other methods of moments are popular methods for obtaining a mesh model (also referred to as a mesh) to represent electromagnetic circuits, including a substrate. However, for substrate modeling, these methods are not without their own serious challenges. For instance in FDM, FDM uses a finite difference basis to generate a uniform discretized mesh, which incurs substrate over-meshing. In addition, FDM yields unnecessarily dense grids far from contact sources. Thus, although FDM leads to a straightforward resistor network, the resulting matrix sizes are prohibitive due to the substrate size, which becomes a bottleneck in implementing the finite difference method. The finite element method does not require uniform meshes. Instead, FEM uses a finite element basis that requires a full 3-D basis, such as a tetrahedral, which leads to additional complexity.

These difficulties have led to the boundary element method ("BEM"). In BEM, only the contact surfaces need to be meshed, leading to far fewer unknowns than the other methods. BEM also requires that Green's function, which satisfies Poisson's equation for the substrate coupling problem, be determined. By enforcing the continuity of potential and normal current flow across layer boundaries, Green's function can be obtained analytically for cases with uniformity.

Generally, the evaluation of Green's function was limited to the top layer of a substrate. Thus, it allowed the contacts to be located only on the top substrate surface. In later developments, the evaluation of the Green's function was extended to handle arbitrarily located contacts in the substrate with the same boundary condition by enabling Green's function evaluation in any layer. In addition, Green's function can be applied to a two-layer substrate with perfect magnetic wall boundary conditions and to a multilayered substrate lying on the ground plane with perfect magnetic sidewalls and top surface.

However, even with the advancements in applying Green's function, the numerical computations of Green's function impose difficult challenges. If the substrate is given with different boundary conditions or has irregular layers with arbitrary variations in conductivity, a complete solution to derive the analytic Green's function does not currently exist. To overcome this, attempts were made to reduce the cost of FEM and FDM by eliminating a substantial fraction of the internal nodes, also referred to as network reduction. Examples of such network reduction techniques to simplify RC networks are a congruence transform, Voronoi polygons, and a combined BEM/FEM based network reduction method.

As a mixed technique, the combined BEM/FEM method solves separate problems in their own domains. In addition, BEM and FEM results are combined via the potentials in the interface nodes to take advantage of the versatility of BEM and FEM (which is cheaper for a regular structure). For the meshing requirement, the BEM mesh should be the dual of the triangular FEM mesh to enforce the constraint that the node along the interface is aligned. In practice, it is very difficult to enforce this meshing requirement since the nodes along the interface are typically not aligned. Current art does not provide any means to align the nodes for a more accurate mesh.

Therefore, it is desirable to present novel methods for electromagnetic circuit modeling, which corrects for the mismatched interface nodes in a mesh and reduces the amount of complexity of the mesh.

SUMMARY OF INVENTION

An object of this invention is to provide layered and adaptive meshing methods for extracting substrate impedance using a combination of FEM and FDM to represent a substrate.

Another object of this invention is to provide methods for expressing the potential at various points on panels of an electromagnetic circuit model using modified finite difference equations.

Yet another object of this invention is to provide synchronization methods that correct for nonaligned interface nodes of a mesh to satisfy the meshing requirement.

Briefly, the present invention discloses a simulation method for simulating a three-dimensional structure, comprising the steps of: discretizing the three-dimensional structure into two-dimensional ("2-D") layers constructing a two-dimensional basis for each of the 2-D layers; and constructing a one-dimensional finite difference basis between the 2-D layers.

An advantage of this invention is that layered and adaptive meshing methods for extracting substrate impedance using a combination of FEM and FDM to represent a substrate are provided.

Another advantage of this invention is that methods for expressing the potential at various points on panels of an electromagnetic circuit model using modified finite difference equations are provided.

Yet another advantage of this invention is that synchronization methods that correct for nonaligned interface nodes of a mesh to satisfy the meshing requirement are provided.

DESCRIPTION OF THE DRAWINGS

The foregoing and other objects, aspects, and advantages of the invention can be better understood from the following detailed description of the preferred embodiment of the invention when taken in conjunction with the accompanying drawings in which.

DETAILED DESCRIPTION OF THE PREFERRED EMBODIMENTS

Figure 1:
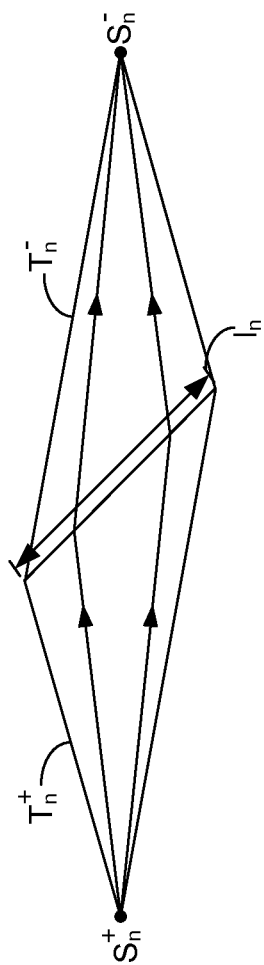
FIG. 1 illustrates an example in which the current direction of a RWG basis is constructed in two dimensions.

In the following detailed description of the embodiments, reference is made to the accompanying drawings, which form a part hereof, and, in which, may be shown by way of illustration of specific embodiments in which the present invention may be practiced.

Although the operations of some of the disclosed methods are described in a particular order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

The disclosed technology can be used, for example, to analyze impedance effects on digital, analog, or mixed-signal integrated circuits. Furthermore, the disclosed technology can also be applied to any electromagnetic circuit or other scientific field of study, where FDM and FEM equations are used to for modeling. In particular, the main example provided below is to model parasitic impedance effects of a substrate. However, this is not meant to limit the present invention in any way. It can be appreciated that the present invention can be applied to any electromagnetic circuit or other scientific field of study, where FDM and FEM equations are used for modeling.

Any of the disclosed methods can be performed using software stored on a computer-readable medium and executed on a computer. Such software can comprise, for example, an electronic-design-automation ("EDA") software tool used, for instance, for physical verification or synthesis. Such software can be executed on a single computer (e.g., any suitable commercially available computer) or on a networked computer (e.g., via the Internet, a wide-area network, a local-area network, a client-server network, or other such network). For clarity, software-based implementations are not described in detail since the disclosure enables a person having ordinary skill in the art to implement the methods of the present invention using a specific computer language, program, and/or computer. For the same reason, computer hardware is not described in detail.

In addition, any of the disclosed methods of the present invention can be used to generate a representation of the electrical characteristics of a circuit. The disclosed methods of the present invention can also be used to modify or design a circuit represented as circuit design information stored on computer-readable media. The circuit design information can comprise, for example, one or more design files or data structures (such as a GDSII or Oasis file) and can be created or modified on a single computer or via a network. Additionally, impedance information or any intermediate information determined using any of the disclosed methods may be stored in one or more data structures or design databases stored on computer-readable media.

The disclosed methods of the present invention can be used at one or more stages of an overall synthesis scheme. For example, any of the inductance extraction methods disclosed can be used during physical synthesis (e.g., during the physical verification process) in order to evaluate and improve the implemented design.

In the present invention, a finite difference method based on layered and adaptive meshing is presented to model an electromagnetic circuit, including to model substrate impedance. To allow for layered and adaptive meshing, a novel synchronization method is introduced which expresses the voltage potential at various points of panels by modifying the finite difference equations. Thereby, the high computational cost of the finite difference method due to tight uniform meshing requirements can be overcome with a straightforward implementation for handling of irregular/arbitrary substrate structures to extract the substrate coupling of integrated circuits.

An adaptive and layered simulation method of the present invention for simulating a three-dimensional structure, includes the steps of: discretizing the three-dimensional structure into two-dimensional ("2-D") layers; constructing a two-dimensional basis (e.g., a finite element basis using a finite element method or a finite difference basis using a finite difference method) fir of the 2-D layers; and constructing a one-dimensional finite difference basis between the 2-D layers. The adjacent 2-D layers are connected to each other by the one-dimensional finite difference basis using a synchronization method to determine a synchronization voltage difference between any points on the panels that span across adjacent 2-D layers. The synchronization method includes the steps of: determining a centroid voltage difference between respective centroids of the panels that span across adjacent 2-D layers; determining a correction voltage; and determining the synchronization voltage difference based on the centroid voltage difference and the correction voltage. In this manner, the constructed 2-D layers can represent the three-dimensional structure for electromagnetic analysis.

Generally, the finite element method ("FEM") is a numerical technique for finding approximate solutions of partial differential equations ("PDE") as well as integral equations. FEM is characterized by the following process: a grid is chosen for a given domain (the grid can consist of triangles, squares, or other curvilinear polygons); then, a basis function is chosen (e.g., a piecewise linear basis functions, piecewise polynomial basis functions, or RWG basis); and with the basis function, a matrix form of the problem is obtained for analysis.

In addition, the finite difference method ("FDM") is a numerical method for approximating the solutions to differential equations using finite difference equations. A finite difference is a mathematical expression of the form f(x+b)−f(x+a). FDM is characterized by the following process: a grid is chosen for given domain (the grid is restricted to handle rectangular shapes and simple alterations); then, a basis function is chosen, e.g., a pulse basis (generally, choices for the basis function are much more restricted than the FEM basis to derive a finite difference expression); and with this basis function, a matrix form of the problem is obtained for analysis. In some formulations, FDM can be considered a special case of the FEM approach. For instance, FEM with rectangular grids with simple basis functions may lead to the same matrix as one from FDM.

With respect to the present invention, to handle arbitrarily shaped contacts efficiently, the Rao-Wilton-Glisson ("RWG") basis is constructed horizontally. Note that horizontal and horizontally can refer to a two-dimensional plane, e.g., the x-y plane, or a two-dimensional layer. Vertically, the pulse basis is used to take advantage of the layered character of a substrate. Note that vertical and vertically can refer to a third dimension, e.g., the z-direction, that is perpendicular to the two-dimensional plane. Even more so, vertically connected can refer to the perpendicular connection between two parallel planes.

Kirchhoff's voltage law for these bases naturally requires that the unknowns of the resulting matrix system are the voltages of centroids of panels. This constraint leads to uniform meshing across the different layers for the finite difference method, which incurs a prohibitively high computational cost. By introducing a one-dimensional synchronizing integration on the constructed RWG basis, uniform meshing can be avoided and substrate problems can be solved using the finite difference method on layered and adaptive meshing.

The synchronization method of the present invention allows for the removal of the meshing requirement of matching interface nodes. With the synchronization method, a combination FDM/FEM is developed to extract substrate impedance using a two-dimensional FEM and one-dimensional layered FDM. The layered FDM with synchronization allows layered and adaptive meshing which ensures the optimal number of voltage nodes, therefore avoiding the necessity of additional node reductions.

For electromagnetic problems, the most popular bases for the methods of moments are the Rao-Wilton-Glisson ("RWG") basis and the pulse basis. The RWG basis is constructed using triangular panels. The RWG basis also removes the presence of an artificial line or point charges across the surface edges because the normal current component across the triangle edge is unity, which leads to superior accuracy.

The pulse basis is constructed using rectangular panels, and has a normal component of unity across the common edge shared by two rectangles. Although it lacks versatility, unlike the RWG basis constructed on triangles, the pulse basis performs more efficiently for path type geometry and gives good insights. For example, the resistance computed from the pulse basis is the regular resistance formula (length divided by cross-sectional area and sigma). Therefore, the RWG basis and the pulse basis can be adopted to take advantage of the versatility of the RWG basis and the simplicity of the pulse basis.

Constructing a Resistor Network

In constructing a resistor network, it is assumed that adaptive triangular meshes are given in the x-y plane and the meshes are copied across the z direction. Resistance formulas from the Rao-Wilton-Glisson basis in the x-y plane and from the pulse basis in the z direction are given to construct a resistor network. The voltage unknowns can be the values of the centroids of meshes for Kirchhoff's voltage law ("KVL") equation.

To extract the substrate impedance, KVL and Kirchhoff's current law ("KCL") are applied. In general, Kirchhoff's voltage law for a system can be represented by:

$$\frac{\vec{J}(r)}{\sigma} + jw \int_V G_A(r, r') \vec{J}(r') = -\nabla \phi(r) \quad (1a)$$

where $\vec{J}(r)$ is a current density function, $\sigma$ is an electrical conductivity, w is a frequency, j is an imaginary unit, $G_A(r,r')$ is a Green's function that characterizes the vector potential response at position r due to a current dipole excitation at r', V is volume, and $\phi(r)$ is an electric potential function. For substrate analysis, w in Equation (1a) can be approximated by zero, thereby eliminating the integral term. Thus, KVL can be represented as $$\frac{\vec{J}(r)}{\sigma} = -\nabla \phi(r), \quad (1b)$$

where $\vec{J}(r)$ is the volume current density, $\sigma$ is the conductivity, and $\phi(r)$ is the electric scalar potential.

The RWG basis is constructed horizontally to handle arbitrarily shaped contacts efficiently and the pulse basis is constructed vertically for the current density, $\vec{J}(r)$. The RWG basis in two dimensions is constructed along each triangle edge.

FIG. 1 illustrates an example in which the current direction of the RWG basis is constructed in two dimensions. The normal current flux along the common edge of triangles $T_n^+$ and $T_n^-$ is unity, which removes an artificial line or point charge. The normal flux along the boundary edges are zero.

The current direction of the RWG basis across the common edge of the two triangles $T_n^+$ and $T_n^-$ can start from a vertex $s_n^+$ of the triangle $T_n^+$ and end at a vertex $s_n^-$ of the triangle $T_n^-$. The current basis $\vec{f}_n(s)$ is defined as $$\vec{f}_n(s) = \begin{cases} \frac{l_n}{2A_n^+}(\vec{s} - s_n^+), & s \text{ in } T_n^+ \\ \frac{l_n}{2A_n^-}(s_n^- - \vec{s}), & s \text{ in } T_n^- \\ 0, & \text{otherwise} \end{cases} \quad (2)$$

where $l_n$ is the length of the common edge, $A_n^\pm$ are the areas of $T_n^\pm$, and s is a point coordinate defined with respect to a global coordinate origin O. The normal components of $(\vec{s} - s_n^+)$ and $(s_n^- - \vec{s})$ on the common edge of $T_n^\pm$ are the heights of triangles $T_n^\pm$. Therefore, the normal component of the RWG basis is unity. Since there is no discontinuity in the normal current component along the edge, the RWG basis removes artificial line or point charges.

To account for the volumetric horizontal currents (e.g., in the x-y plane), it is assumed that the basis current flows uniformly in the x-y plane and is normalized by a cross-sectional area so that each basis function coefficient represents the actual filament current, $\vec{I}(r)$. Therefore, the new horizontal basis $\vec{m}_n(r)$ is given as $$\vec{m}_n(r) = \vec{f}_n(s) \frac{1}{l_n h_n}, \quad r \in T_n^\pm(s) \times h_n \quad (3)$$

where $l_n$ is the length of the $n^{th}$ edge and $h_n$ is the thickness of the layer along the z direction.

If the Galerkin method is applied to Equation (1b) with the basis $\vec{m}_n(r)$, then $\vec{J}(r)$ is approximated as $$\vec{J}(r) \approx \sum_m \vec{m}_m(r).$$

In addition, both sides of Equation (1b) can be integrated with $\vec{m}_n(r)$ to obtain the resistance $R_{n,m}$, thereby extracting the KVL equation as follows:

$$R_{n,m} = \frac{1}{\sigma} \int_V \vec{m}_n(r) \cdot \vec{m}_m(r) dv \quad (4)$$

$$= \sum_{i,j \in \{\pm\}} \frac{1}{\sigma h} \frac{1}{4 A_n^i A_m^j} \int_{T_n^i \cap T_m^j} \rho_n^i(s) \cdot \rho_m^j(s) ds$$

where $\rho_n^\pm(s) = \pm(\vec{s} - s_n^\pm)$. Therefore, each current element is connected to at most five current elements including itself through the resistance since $R_{n,m}$ equals to zero if the compact supports of $\vec{m}_n(r)$ and $\vec{m}_m(r)$ are disjointed.

Figure 2:
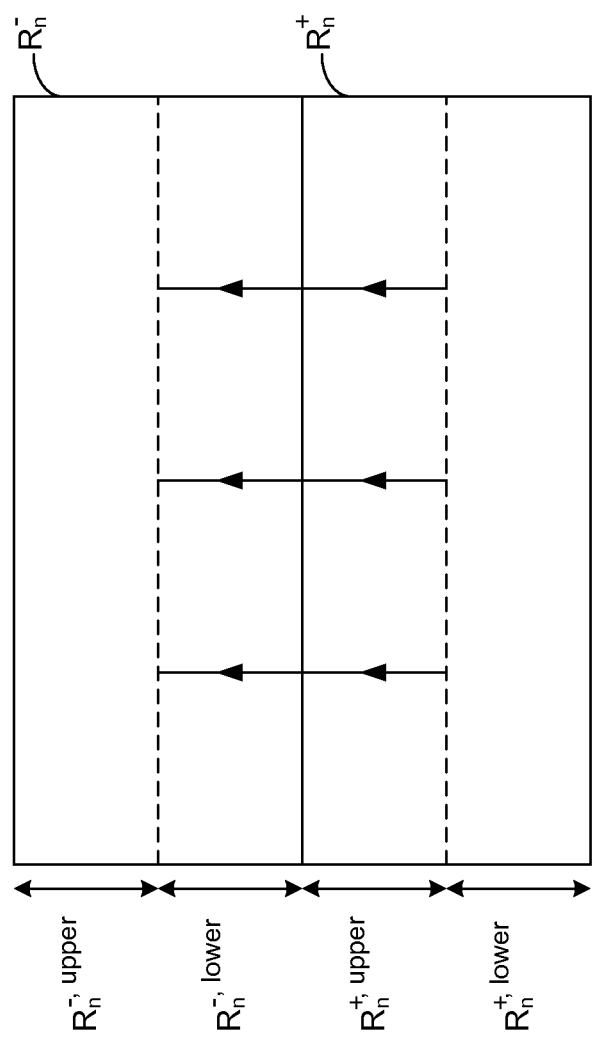
FIG. 2 illustrates an example of a pulse basis constructed on two rectangular panels in two dimensions.

FIG. 2 illustrates an example of a pulse basis constructed on two rectangular panels in two dimensions. The compact supports of the basis are $R_n^{+,upper}$ and $R_n^{-,lower}$. The vertical pulse basis for the z direction can be constructed to take advantage of the layered character of the substrate. For clarity, the vertical pulse basis for two dimensions, illustrated in FIG. 2, can be generalized for three dimensions. When two rectangular panels $R_n^+$ and $R_n^-$ are stacked vertically, the pulse current flows uniformly in a single direction, starting from the middle of $R_n^+$ to the middle of $R_n^-$ so that the voltage node unknowns are located at the centers of the rectangular panels. Therefore, the pulse basis is defined as $$\vec{f}_n(s) = \begin{cases} \hat{z}, & s \text{ in } R_n^{+,upper} \text{ or } R_n^{-,lower} \\ 0, & \text{otherwise.} \end{cases} \quad (5)$$

where $\hat{z}$ is (0,1).

Figure 3:
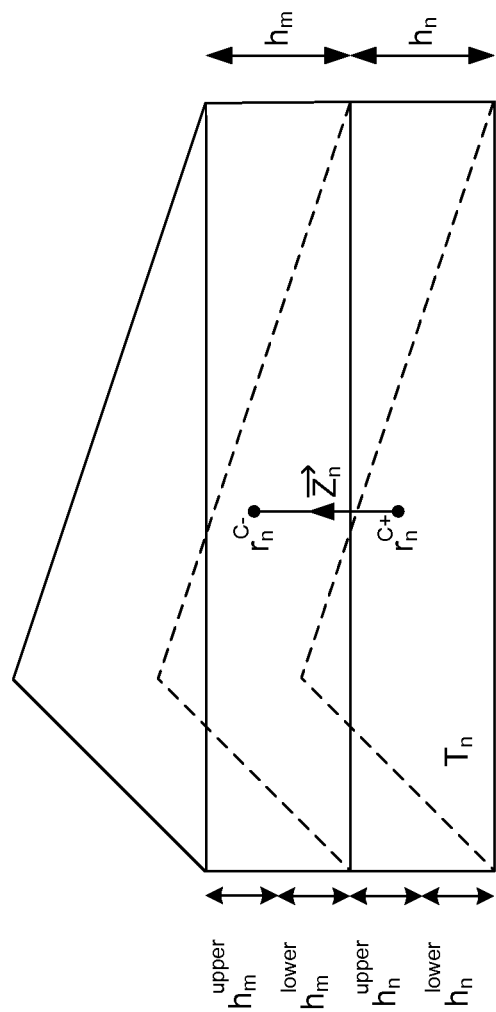
FIG. 3 illustrates an example for a three-dimensional basis case, where two triangular blocks $T_n \times h_n$ and $T_n \times h_m$ are stacked vertically.

FIG. 3 illustrates an example for a three-dimensional basis case, where two triangular blocks $T_n \times h_n$ and $T_n \times h_m$ are stacked vertically. A vertical pulse basis current $\hat{z}_n$ can be constructed on two triangular blocks $T_n \times h_n$ and $T_n \times h_m$. The pulse basis current for the vertical current can then be defined as $$\vec{m}_n(r) = \frac{\hat{z}}{\text{area}(T_n)} \quad (6)$$

for $r \in T_n(s) \times h_n^{upper}$ or $T_n(s) \times h_m^{lower}$ where $\hat{z}$ is (0,0,1).

Since the compact supports of the pulse basis currents are disjointed, the dot product of different pulse currents is zero. Therefore, a nonzero resistance can be obtained for self-interaction as $$R_{n,n} = \frac{1}{\sigma} \int_V \vec{m}_n(r) \cdot \vec{m}_n(r) dv \quad (7)$$

$$= \frac{1}{2\sigma} \frac{h_n + h_m}{\text{area}(T_n)}.$$

The dot product of a vertical pulse basis current and a horizontal RWG basis is zero. Thus, there is no other resistance except those computed in Equations (4) and (7). Therefore, the resistance formulas from the left hand side of Equation (1b) can be derived.

By defining $r_n^{c+}$ and $r_n^{c-}$ as the centroids of $T_n \times h_n$ and $T_n \times h_m$, it can be shown that the right side of Equation (1b) leads to the voltage difference between $r_n^{c+}$ and $r_n^{c-}$ if we apply the Galerkin method. With the RWG basis $\vec{m}_n(r)$ defined on $T_n^\pm \times h$, the following is obtained $$-\int_V \nabla \phi(r) \cdot \vec{m}_n(r) dv = \int_h dz \int_{T_n^\pm} \phi(r) \nabla_s \cdot \vec{m}_n(r) ds \quad (8)$$

$$= \int_z dz \left( \int_{T_n^+} \frac{\phi(r)}{A_n^+ h_n} ds - \int_{T_n^-} \frac{\phi(r)}{A_n^- h_n} ds \right)$$

$$\cong \phi(r_n^{c+}) - \phi(r_n^{c-}).$$

Here, the fact of the normal current flux on the surface boundary of $T_n^\pm \times h$ equals to zero can be used.

The pulse basis $\vec{m}_n(r)$, whose compact support is $T_n(s) \times h_n^{upper}$ and $T_n(s) \times h_m^{lower}$, gives $$-\int_V \nabla \phi(r) \cdot \vec{m}_n(r) dv = -\int \frac{1}{\text{area}(T_n)} dx dy \int_z \frac{\partial \phi}{\partial z} dz \quad (9)$$

-continued $$\cong \phi(r_n^{c+}) - \phi(r_n^{c-}).$$

Therefore, the following KVL representation can be obtained from Equation (1b) as the following:

$$\sum_m R_{n,m} I_m = \phi(r_n^{c+}) - \phi(r_n^{c-}). \tag{10}$$

Extracting the Y Parameter

In this section, KVL and KCL are used to extract impedance from contacts to contacts of a substrate. In order to reduce the computational costs in the bottom layers for a mesh, an adaptive triangular meshing method on each layer of the substrate can be used that is varied depending on the distance from the contacts to each respective layer. However, since the triangles of each of the layers do not match vertically, a synchronization method of the present invention is introduced to correct for the voltage difference between different triangles of the mesh along the z direction. In this manner, a strategy of a two-dimensional FEM and a one dimensional FDM can be implemented to solve a three-dimensional substrate problem. Finally, in order to show the accuracy of the synchronization method of the present invention, numerical resistance values of a thin wire computed with and without the synchronization method are compared to the approximate analytical value and compared to the computed resistance value from uniform meshing. Additionally, two numerical examples of a substrate problem are presented for comparison of a synchronization method of the present invention to the approximate analytical value and the computed resistance value from uniform meshing.

Figure 4:
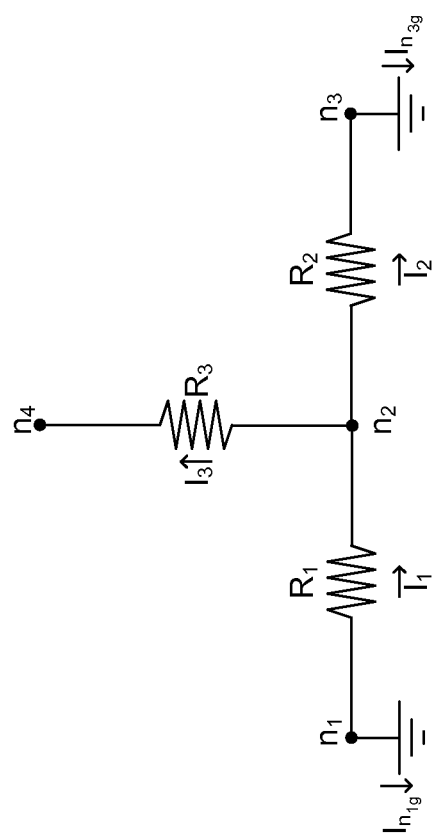
FIG. 4 illustrates a circuit example that has four ports $n_1$, $n_2$, $n_3$, and $n_4$ (two of which are grounded) and three currents $I_1$, $I_2$, and $I_3$.

In order to understand how to stamp the resistance derived above into a system to extract impedance, a simple circuit example can be used for instructional purposes. It is appreciated that the methods of the present invention can also be used to extract impedance values for other circuits of greater or lesser complexity as well. FIG. 4 illustrates a circuit example having four ports $n_1$, $n_2$, $n_3$, and $n_4$ with three currents $I_1$, $I_2$, and $I_3$. Ports $n_1$ and $n_3$ can be grounded. KVL of Equations (1b) and (10), KCL, and contact ports can be stamped into a matrix system, and represented by a matrix equation. Since the voltage values of ports $n_1$ and $n_3$ are given, then the currents in the circuit can be computed by enforcing KVL and KCL via a Matrix Equation (11). The first three rows of the Matrix Equation (11) represent KVL, and the next four rows represent KCL. The last two rows of the Matrix Equation (11) represent stamping ports into an equation.

$$\begin{bmatrix} R_1 & 0 & 0 & -1 & 1 & 0 & 0 & 0 & 0 \\ 0 & R_2 & 0 & 0 & -1 & 1 & 0 & 0 & 0 \\ 0 & 0 & R_3 & 0 & -1 & 0 & 1 & 0 & 0 \\ 1 & 0 & 0 & 0 & 0 & 0 & 0 & 1 & 0 \\ -1 & 1 & 1 & 0 & 0 & 0 & 0 & 0 & 0 \\ 0 & -1 & 0 & 0 & 0 & 0 & 0 & 0 & 1 \\ 0 & 0 & -1 & 0 & 0 & 0 & 0 & 0 & 0 \\ 0 & 0 & 0 & 1 & 0 & 0 & 0 & 0 & 0 \\ 0 & 0 & 0 & 0 & 1 & 0 & 0 & 0 & 0 \end{bmatrix} \begin{bmatrix} I_1 \\ I_2 \\ I_3 \\ V_{n_1} \\ V_{n_2} \\ V_{n_3} \\ V_{n_4} \\ I_{n_1 g} \\ I_{n_3 g} \end{bmatrix} = \begin{bmatrix} 0 \\ 0 \\ 0 \\ 0 \\ 0 \\ 0 \\ 0 \\ V_{n_1} \\ V_{n_3} \end{bmatrix} \tag{11}$$

Voltages and currents are unknowns of the assembled matrix system in Equation (11). Thus, SPICE simulations are not used. Instead, resistance represents resistance between current elements of the discretized mesh. After solving the matrix system, currents and voltages can be obtained on each current element on the meshed geometry, while exciting one contact port and keeping all the other ports grounded. By measuring the current amounts on the ports, an admittance matrix Y between contacts on the substrate can be obtained to satisfy I=YV, where Y is an n×n element matrix and where n is the total number of ports.

Synchronization Theory Based on One-Dimensional Integration

For a real application, meshing needs to be adaptive to avoid unnecessarily dense meshing far from source contacts. Therefore, triangles on different layers of the mesh will have centroids not matched along the z direction. To remedy the difference, a synchronization method of the present invention can be used to account for the centroids not matching up along the z direction.

Figure 5:
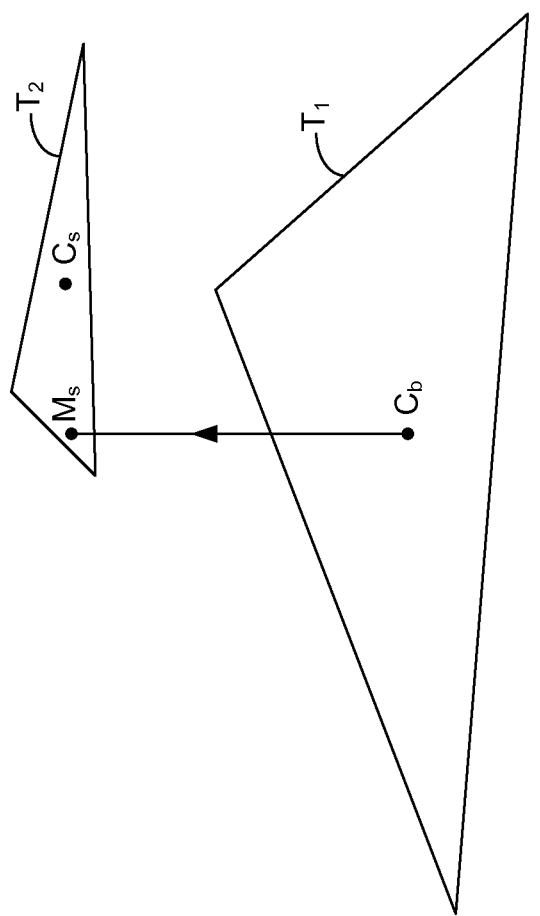
FIG. 5 illustrates two triangles on two different layers along the x-y plane, where the respective centroids of the two triangles do not match up (i.e., are not aligned along the z direction).

FIG. 5 illustrates two triangles on two different layers along the x-y plane, where the respective centroids of the two triangles do not match up (i.e., are not aligned along the z direction). Other triangles can be present in the x-y plane to cover an entire bounded area, where their respective centroids may not match up along the z direction between the other triangles of two layers.

By constructing the pulse basis from triangles of one layer to another layer, the following voltage equation can be obtained:

$$R_{n,n} I_n = \phi(C_b) - \phi(M_s). \tag{12}$$

Referring to the example illustrated in FIG. 5, the pulse basis is from a triangle T1 on the bottom layer to a triangle T2 on the top layer. Thus, the pulse basis is constructed on the two triangles T1 and T2, where the respective centroids of the triangles T1 and T2 are not aligned along the z direction.

Since the centroids are not aligned along the z direction, Equation (12) cannot be easily enforced since the voltage unknowns are values for the centroids of the triangles T1 and T2. However, Equation (12) can be modified as follows to handle such cases, $$R_{n,n} I_n = \phi(C_b) - \phi(C_s) + \phi(C_s) - \phi(M_s), \tag{13}$$

where the term $\phi(C_s) - \phi(M_s)$ can be referred to as a correction voltage. Equation 13 can be referred to as a synchronization voltage difference having two components, the centroid voltage difference and a correction voltage. The correction voltage, $\phi(C_s) - \phi(M_s)$, can be computed with a one-dimensional integral as follows inside of the small triangle, $$\phi(C_s) - \phi(M_s) = -\int_{C_s}^{M_s} \nabla \phi(r) \cdot dl = \int_{C_s}^{M_s} \frac{\vec{J}(r)}{\sigma} \cdot dl. \tag{14a}$$

The horizontal current $\vec{J}(r)$ is the sum of the RWG basis constructed along the edges. In general, each triangle has three currents associated with it. Synchronization requires at most three line integrals of the RWG basis whose formula is given as follows, $$\int_{C_s}^{M_s} \vec{m}_n(r) dl = \int_{C_s}^{M_s} \vec{f}_n(r) \frac{1}{l_n h_n} \cdot dl = \frac{1}{2 A_n^{\pm} h_n} \int_{C_s}^{M_s} \rho_n^{\pm} \cdot dl \tag{15}$$

$$= \frac{1}{2 A_n^{\pm} h_n} \int_{C_s}^{M_s} \pm (r' - r_n) \cdot dl$$

-continued $$= \frac{1}{2A_n^{\pm}h_n} \int_0^1 (t(M_s - C_s) + C_s - r_n) \cdot (M_s - C_s) dt$$

$$= \frac{1}{2A_n^{\pm}h_n} \left[ \frac{\|M_s - C_s\|^2}{2} + (C_s - r_n) \cdot (M_s - C_s) \right].$$

In this manner, the synchronization term modifies the traditional finite difference equations without increasing the matrix size.

Figure 6:
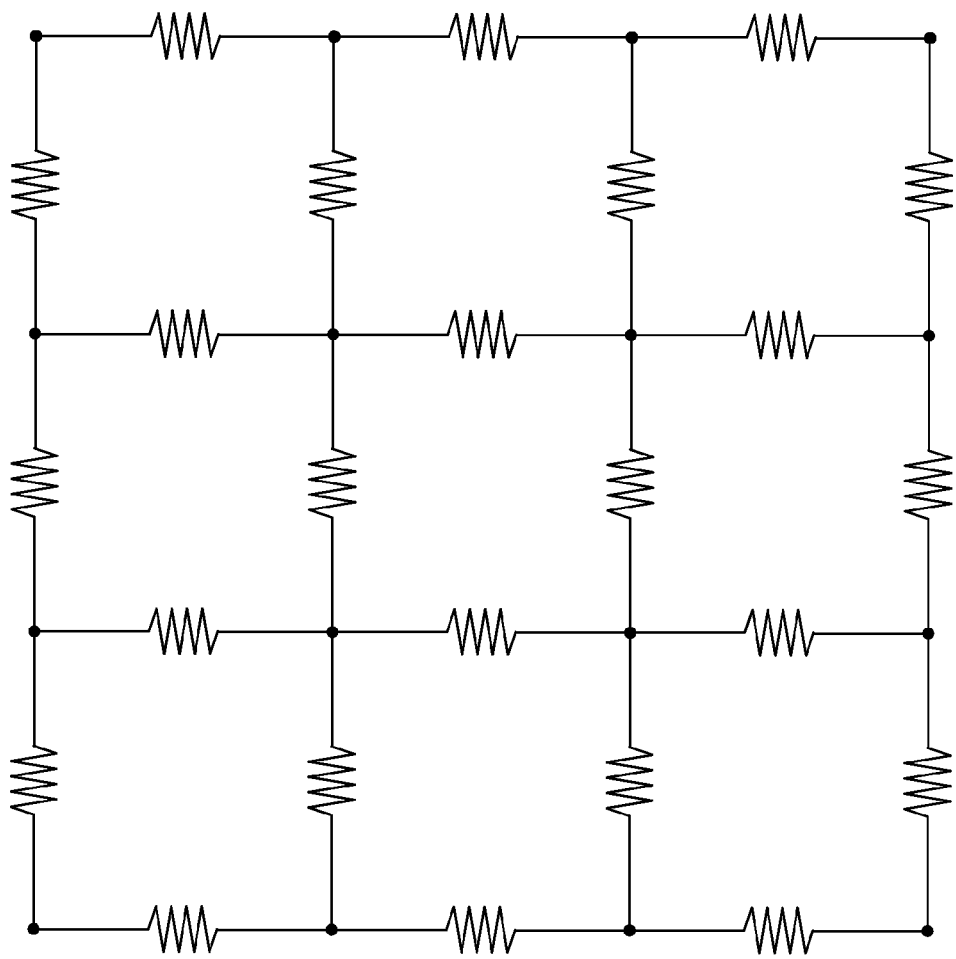
FIG. 6 illustrates a typical resistive mesh of the prior art based on a typical finite difference method.
Figure 7:
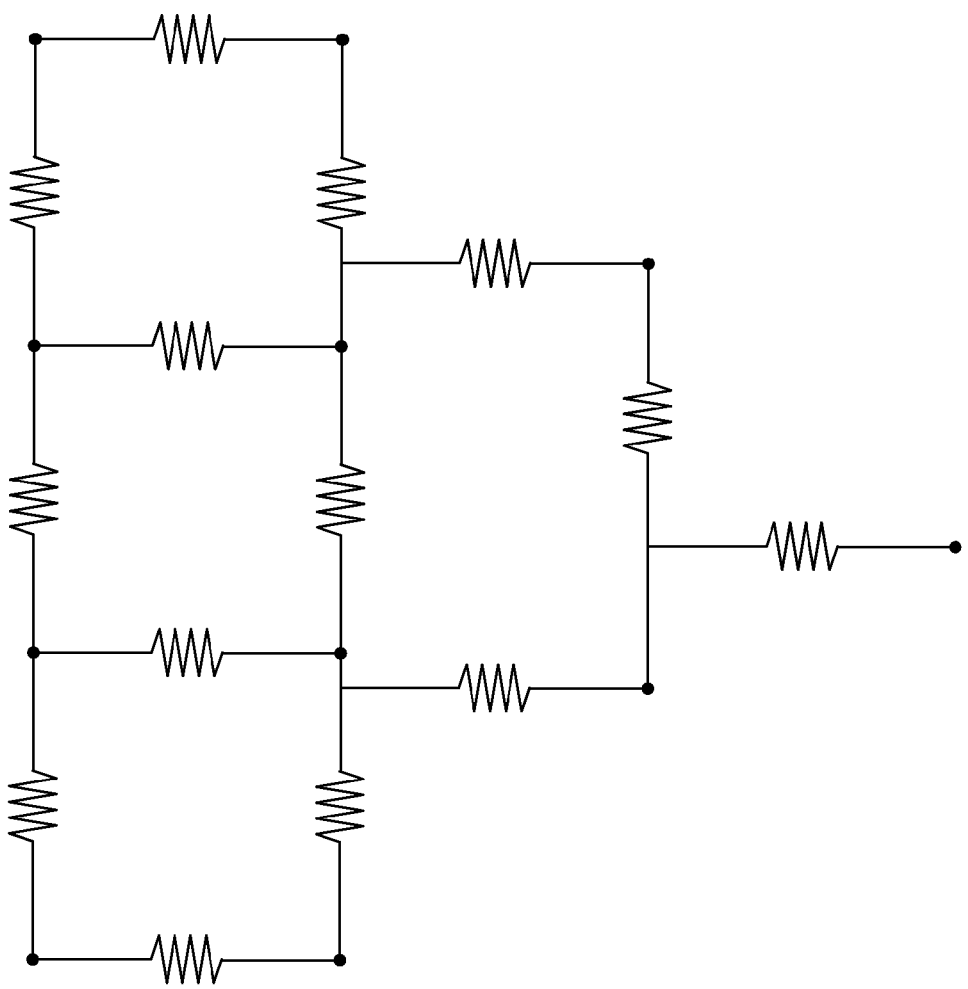
FIG. 7 illustrates an example of a resistive mesh based on layered and adaptive meshing using a synchronization method of the present invention.

In summary, layered FDM using a synchronization method of the present invention effectively reduces a resistor network from a uniform meshing, e.g., the resistor network illustrated in FIG. 6, into a reduced resistor network, e.g., the resistor network illustrated in FIG. 7, without sacrificing accuracy when the bottom nodes of the mesh are redundant. FIG. 6 illustrates a typical resistive mesh of the prior art based on a typical finite difference method. Nodes require uniform node arrangement, which translates into uniform meshing. FIG. 7 illustrates an example of a resistive mesh of the present invention based on a finite difference method using a synchronization method of the present invention. The synchronization method of the present invention allows for the freedom of choice of node locations. Thus, the resistor network illustrated in FIG. 7 has an adaptive layered meshing.

For a general electromagnetic modeling engine, inductance and resistance are computed from current elements which require synchronization of the panels of a model. To aid in the understanding of the invention, an assumption is made that there are $N_f$ full current elements, $N_h$ edge current elements (h stands for half), and $N_q$ charge elements. The relationship, $N_c = N_f + N_h$, is the total number of current elements. Assuming the unknowns are current density on current elements ("J"), charge density on charge elements ("Q"), voltages on charge elements and circuit nodes ("V"), and voltage sources on certain circuit nodes ("$V_s$"), the matrix format for the system equations is:

$$\begin{bmatrix} -(R + j\omega L) & P_{LQ}\Phi & P_{LV} \\ S & j\omega & 0 \\ P_{VJ} & 0 & P_{VV} \end{bmatrix} \begin{bmatrix} J \\ Q \\ V \end{bmatrix} = \begin{bmatrix} 0 \\ 0 \\ V_s \end{bmatrix} \quad (16)$$

The first row represents the $N_f$ equations for full current elements and $N_h$ equations for edge current elements. R is a diagonal matrix whose diagonal value is the resistance of the current element. L is the inductance matrix representing the inductive couplings among $N_c$ current elements. The computation of the inductance matrix uses the multilayered vector potential Green's function, with each element calculated as:

$$L_{ij} = \frac{1}{T_L} \int_{Ci} \int_{Cj} G_A(r, r') dr dr' \quad (17)$$

where $T_L$ is the scaling factor used in inductance computation and Ci Cj are the volumes of the observation current element and source current element respectively. For 3-D conductive elements, $T_L$ is the product of cross section areas of both conductive elements. $\Phi$ is the scalar potential matrix, with each element calculated as:

$$\Phi_{ij} = \frac{1}{T_\phi} \int_{Qi} \int_{Qj} G_\phi(r, r') dr dr' \quad (18)$$

where $T_\phi$ is the scaling factor used in scalar potential integral computation, and Qi and Qj are the areas of the observation charge element and source charge element, respectively. $T_\phi$ is typically the area of the observation (corresponding to the i charge element) element. Q is the unknown coefficients for charge distribution, and thus $\Phi Q$ is the scalar potential, or voltage, on the charge elements due to the existence of Q charges. $P_{LQ}$ is the incidence matrix that indexes each current element equation to the voltage of the overlapping charge element. Similarly, $P_{LV}$ is the incidence matrix that indexes each current element equation to the voltage of the nodes that the edge current element is connected. Notice that although the equations are expressed in a matrix format, the actual implementation uses a stamping method that searches for the indices of the equation and indices of unknowns.

The second row represents the equations related to charge conservation. S is the incidence matrix that indexes the current elements that either flow into or flow out of the charge element.

The third row represents the equations related to node voltages and auxiliary equations for modified nodal analysis. For example, the edge current element is typically connected to a circuit node. Thus, an equation is obtained that makes the total current flowing out of the circuit node, including the current flowing out of the node and flowing into the edge current element, zero. $P_{VJ}$ and $P_{VV}$ are the two incidence matrix to index the corresponding edge currents and node voltages to the KCL equation.

Inductance can be accounted for by starting with Equation (1a), and thereby obtaining the following equation:

$$\phi(C_s) - \phi(M_s) = -\int_{C_s}^{M_s} \nabla \phi(r) \cdot dl \quad (14b)$$

$$= \int_{C_s}^{M_s} \left[ \frac{\vec{J}(r)}{\sigma} + jw \int_V G_A(r, r') \vec{J}(r') \right] \cdot dl.$$

Figure 15:
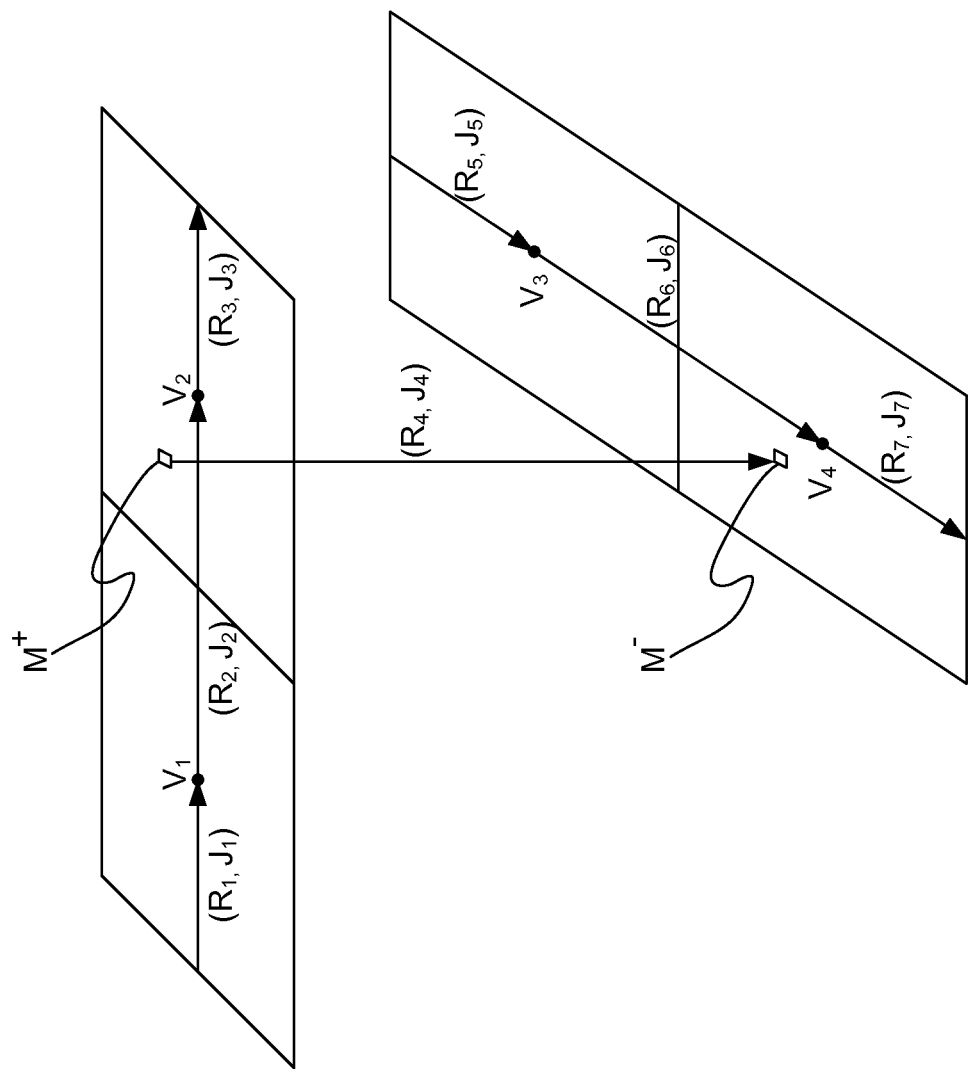
FIG. 15 illustrates panels on two different layers along the x-y plane, where a via is vertically connected between the two layers.

FIG. 15 illustrates panels on two different layers along the x-y plane, where the panels of the layers are connected by a via. Panels on different layers are vertically connected by a via, a current pulse, or other connection, e.g., a via is perpendicular to both the panels to which it is connected. The via starts from point $M^+$ on a first layer to point $M^-$ on a second layer, where the resistance is $R_4$ and the current density is $J_4$. The points $V_1$, $V_2$, $V_3$, and $V_4$ are the centroids for their respective panels. The various resistances for the panels are $R_1$, $R_2$, $R_3$, $R_5$, $R_6$, and $R_7$; and the various current densities for the panels are $J_1$, $J_2$, $J_3$, $J_5$, $J_6$, and $J_7$.

Before synchronization, the vertical current is not positioned from centroid to centroid. Thus, the following original equation for the voltage difference of the centroids is not entirely accurate:

$$R_4 I_4 + jw \sum_j L_{4,j} I_j = V_2 - V_4. \quad (19)$$

where $R_4$ is the resistance of the vertical connection, $I_4$ is the current of the vertical connection, w is a frequency, j is an imaginary unit, $L_4$ is the inductance of the vertical connection, $L_{4,j}$ is an inductance matrix, and $I_j$ is a current matrix, $V_{M+}$ is the voltage at the first point, and $V_{M-}$ is the voltage at the second point.

By applying synchronization, the resistance and inductance matrices are altered giving, $$R_4 I_4 + jw \sum_j L_{4,j} I_j = V_{M+} - V_{M-}. \quad (20)$$

where $R_4$ is the resistance of the vertical connection, $I_4$ is the current of the vertical connection, $L_4$ is the inductance of the vertical connection, $V_{M+}$ is the voltage at the point $M^+$, and $V_{M-}$ is the voltage at the point $M^-$.

To enforce Equation (16), the following is derived $$R_4 I_4 + jw \sum_j L_{4,j} I_j - (V_{M+} - V_2) + (V_{M-} - V_4) = V_2 - V_4 \quad (21a)$$

Equation (21a) can be rewritten to give the following:

$$R_4 I_4 + jw \sum_j L_{4,j} I_j = (V_2 - V_4) + (V_{M+} - V_2) - (V_{M-} - V_4), \quad (21b)$$

where $R_4$ is a resistance value of the vertical connection, $I_4$ is a current value of the vertical connection, w is a frequency, j is an imaginary unit, $L_4$ is an inductance value of the vertical connection, $L_{4,j}$ is an inductance matrix, and $I_j$ is a current matrix, $V_{M+}$ is the voltage at the first point, and $V_{M-}$ is the voltage at the second point, wherein $$R_4 I_4 + jw \sum_j L_{4,j} I_j$$

is the synchronization voltage difference, $(V_2 - V_4)$ is a centroid voltage difference, $(V_{M+} - V_2)$ and $(V_{M-} - V_4)$ are correction voltages.

$$V_{M+} - V_2 = R_{M+,v_2} J_2 + jw \sum_j L_{M+,v_2,j} J_j. \quad (22)$$

Therefore, the Equations (14b) and (16)-(18) can be manipulated to give the following equation, $$R_4 I_4 - R_{M+,v_2} J_2 + R_{M-,v_4} J_6 + \quad (23)$$
$$jw \sum_j (L_{4,j} - L_{M+,v_2,j} + L_{M-,v_4,j}) I_j = V_2 - V_4.$$

Equation (23) can be applied to the cases where both points M+ and M− are not centroids of their respective panels.

Accuracy of the Layered Finite Difference Method with Synchronization

Figure 8:
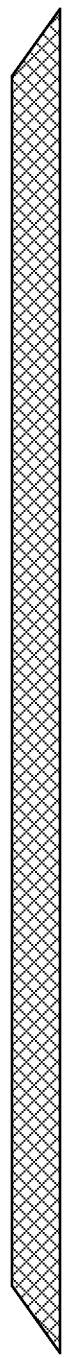
FIG. 8 illustrates a side view of an example of a wire with two contact ports on a top surface (not shown) at the ends of the wire.

To verify the accuracy of layered FDM using a synchronization method, a simple wire example, illustrated in FIG. 8, is presented. It is important to note that the methods of the present invention can be used for any integrated circuit or substrate structure. The substrate example illustrated in FIG. 8 is for illustrative purposes, and is not meant to limit the present invention in any way.

FIG. 8 illustrates a side view of an example of a wire. The wire can have two contact ports on the wire's top surface (not shown on this side view of the wire). The two contact ports are positioned at the ends of the wire. The wire's width, length, and thickness are 10.2 μm, 101.2 μm, and 1 μm, respectively.

Figure 9:
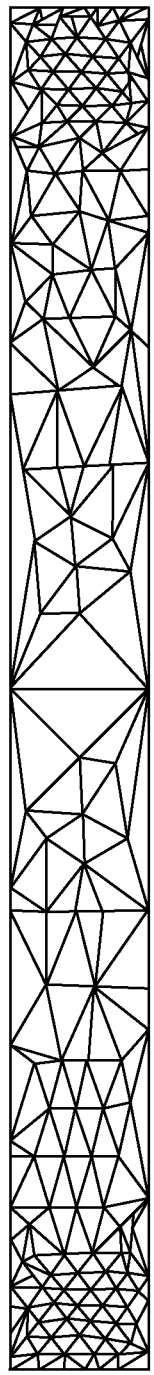
FIG. 9 illustrates a top view of a top layer of a mesh that represents the wire illustrated in FIG. 8.

FIG. 9 illustrates a top layer of mesh that represents a portion of the wire illustrated in FIG. 8. A mesh can be used to derive an approximate analytic resistance value. Two contact ports are constructed at 0.1 μm inward from the end of the line, and each have a width and length of 10 μm and 1 μm, respectively. Along the z direction, the wire is discretized into five layers to incur synchronization operations. Each layer has a varied density along the x-y plane based on the distance of the respective layer from the source contacts. The mesh layer that represents the source contacts is densest, and the mesh layers become sparser as the mesh is farther away from the contacts. The height of each of the mesh layers along the z direction is given by Equation (24), $$h_i = \cos\left(\left(1 - \frac{i}{Nz}\right)\frac{\pi}{2}\right) \times 1(\mu m) \quad (24)$$

where Nz=4 and i=0, 1, . . . , 4.

An approximate analytic resistance between the contact ports when σ equals to 1000 (Sm$^{-1}$) is computed as follows:

$$R_{12} = \frac{100 \ \mu m}{10000 Sm^{-1} \cdot 1 \ \mu m \cdot 10.2 \ \mu m} = 9804(\Omega). \quad (25)$$

Table 1 lists the numerical resistance $R_{12}$ of adaptive meshing along the z direction between two contact ports placed on the ends of the wire. The approximate analytic value of $R_{12}$ is 9804Ω. Table 1 presents comparisons between the accuracy with and without a synchronization method of the present invention, while having exactly the same adaptive meshes along the z direction. The approximate triangle areas on contacts are controlled as 5e-12, 2e-12, 1e-12, and 5e-13 respectively to decrease the meshing space. Triangle numbers for top layers $h_3$ and $h_4$ are 184, 341, 574, and 1328 and the numbers for $h_0$-$h_2$ are 140, 324, 620, and 1108 for the varying contact area constraints above.

The second column of Table 1 shows the maximum of synchronization lengths that is the longest distance between $C_s$ and $M_s$ illustrated in FIG. 5. A two-by-two admittance matrix for a two port problem can be obtained, and the resistance $R_{12}$ is computed from $Y_{12}$. The resistance $R_{12}$ on the third column of Table 1 computed with the synchronization method of the present invention matches very well with the expected analytic resistance computed above. The resistance $R_{12}$ computed without synchronization shown on the fourth column in Table 1 is far off from the analytic value of 9804Ω.

TABLE 1

| The number of unknowns N | Maximum of Synchronization length | $R_{12}$ (Ω) with synchronization | $R_{12}$ (Ω) without synchronization |
|---|---|---|---|
| 2254 | 5.2 μm | 10140 | 7758 |
| 4853 | 5.0 μm | 9878 | 7435 |
| 8991 | 5.9 μm | 9857 | 7234 |
| 17526 | 5.0 μm | 9833 | 8214 |

Without synchronization, the mesh is very inaccurate, leading to the random behavior in terms of convergence.

Table 2 is generated by copying the top meshing all the way down to have a uniform meshing along the z direction with the same area control applied on contacts as in Table 1. Thus, the meshes on each layer are identical to the top meshes generated in Table 1. In addition, the other parameters are the same as the parameters used to compute the values in Table 1.

TABLE 2

| The number of unknowns N | $R_{12}$ ($\Omega$) with uniform meshing in z direction |
|---|---|
| 2752 | 9929 |
| 5117 | 9872 |
| 8610 | 9855 |
| 19926 | 9833 |

Numerical Results of Substrate Examples

To show the efficiency of the layered FDM using a synchronization method of the present invention, the following two substrate examples are provided to illustrate how to apply the methods of the present invention. These two examples are in no way meant to limit the present invention. A person having ordinary skill in the art can appreciate that the methods of the present invention can be applied to various substrates, to various integrated circuits, and to various other fields that use meshes.

In the following, the resistances from the substrate examples with and without using a synchronization method of the present invention are compared to an approximate analytic value and the resistance from uniform meshing. The numerical tables for the simple substrate problem of size 300 μm×210 μm×300 μm are presented to show its convergence and the advantage in terms of memory usage and speed. Finally, a substrate example of size 4200 μm×4340 μm×300 μm is presented to show the voltage distribution and resistance between ports from layered finite difference method with synchronization.

a. First Substrate Example

Figure 10:
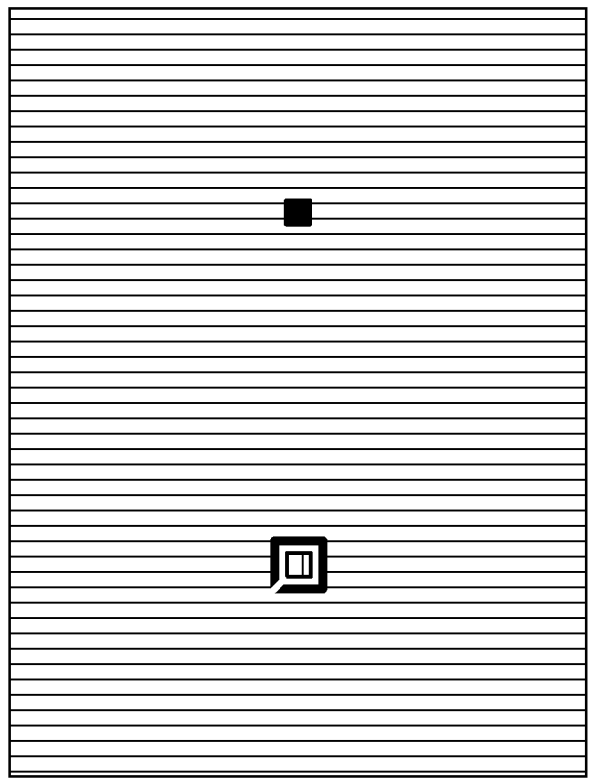
FIG. 10 illustrates a top view of a first substrate example, where the substrate has two square contact ports and a guard ring.
Figure 11:
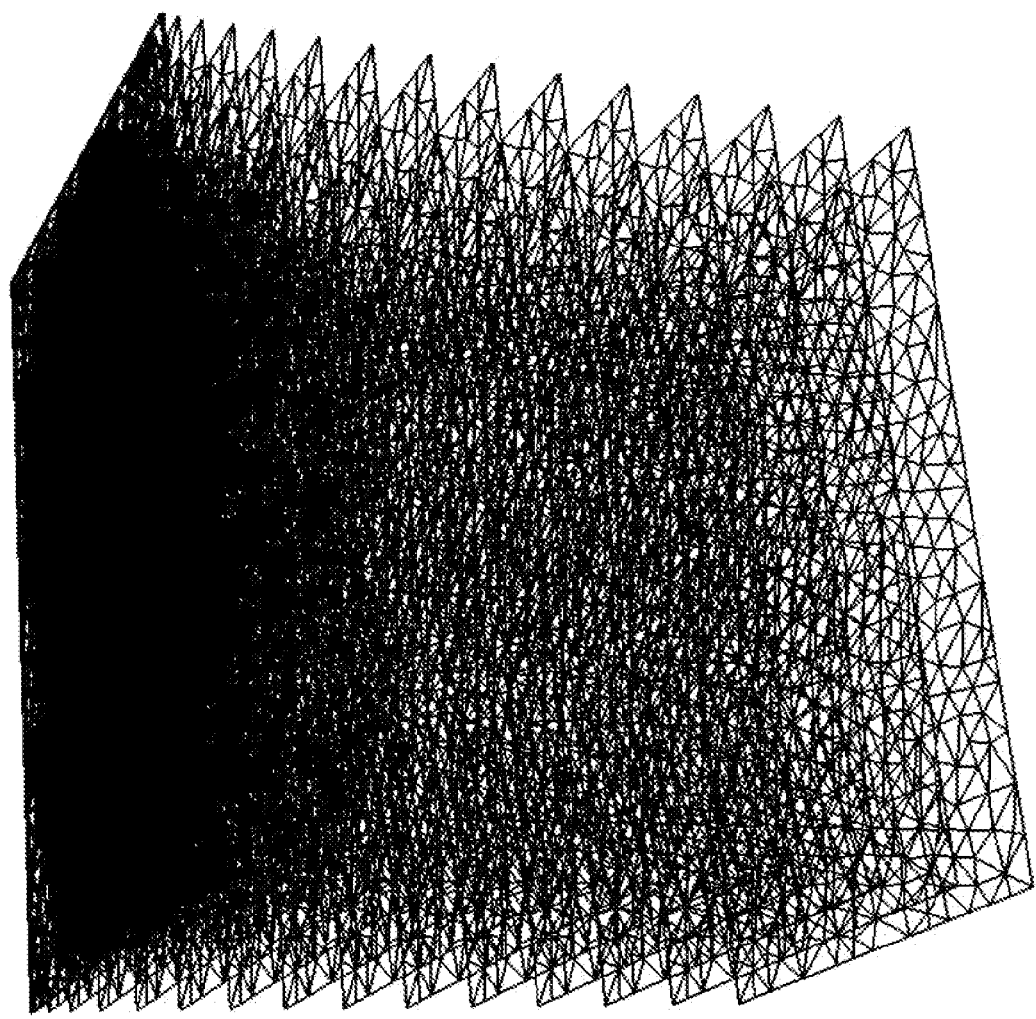
FIG. 11 illustrates a side perspective view of the first substrate example, illustrated in FIG. 10, divided into representative layers.

FIG. 10 illustrates a top view of a first substrate example, where the substrate has two square contact ports and a guard ring. FIG. 11 illustrates a side perspective view of the first substrate example, illustrated in FIG. 10, divided into representative layers. In this first example, the substrate has two square contacts and one guard ring, where the substrate size is 300 μm×210 μm×300 μm having conductivity of 10 (Sm$^{-1}$).

To show the convergence of the admittance matrix for the three ports problem, Tables 3-6 are presented. Table 3 is generated by varying the area constraints along the x-y plane with a fixed number of discretizations along the z direction. Table 5 is generated by varying the number of discretizations along the z direction while keeping same area constraints on x-y plane. Mesh layers become sparser as the distance from the contacts is greater. With the adaptive mesh, the admittance matrix Y of size 3×3 is obtained. The maximum distance on which the synchronization method is applied to is in the third column, and the relative error of the Y matrix in the l$^\infty$ norm is presented on the fourth column. The relative error of the Y matrix is computed as follows $$\frac{\max_{i,j}|Y(i,j) - Y_{sol}(i,j)|}{\max_{i,j}|Y_{sol}(i,j)|}$$

and the resistance $R_{ij}$ for i≠j is defined as $$\frac{-1}{\text{real}(Y(i,j))}.$$

Therefore, a small resistance value allows for large current amounts flowing out through the ports. These current amounts determine the relative error of the Y matrix. Therefore, for a very large resistance due to majority of current leaking into other ports, one might expect greater accuracy loss. The last column shows the resistance between the two square ports.

Tables 4 and 6 are generated by uniform meshing along the z direction in which the top meshing layer is copied along the z direction in the other layers. The mesh layers used to generate Tables 4 and 6 are the same as the top mesh layers generated adaptively for Tables 3 and 5. The number of triangles from the top layer to the bottom layer for generating the last row in Table 3 (where contact triangle area tolerance is 1e-12) are 20796, 20796, 20806, 19554, 14734, 11932, 10536, 8984, 5066, 3468, 3468, 3468, 3468, 3468, and 3468. The triangle numbers are fixed as 20796 for all the layers in Table 4. The exact solution to compare with can be found by uniform meshing along the z direction. For Tables 3 and 4, each layer has 34287 triangles for an exact solution with contact triangle area tolerance of 6e-13 and Nz=15. For Tables 5 and 6, top surfaces for all Nz have 4444 triangles with the fixed contact triangle area constraint as 5e-12 in the x-y plane.

Figure 12:
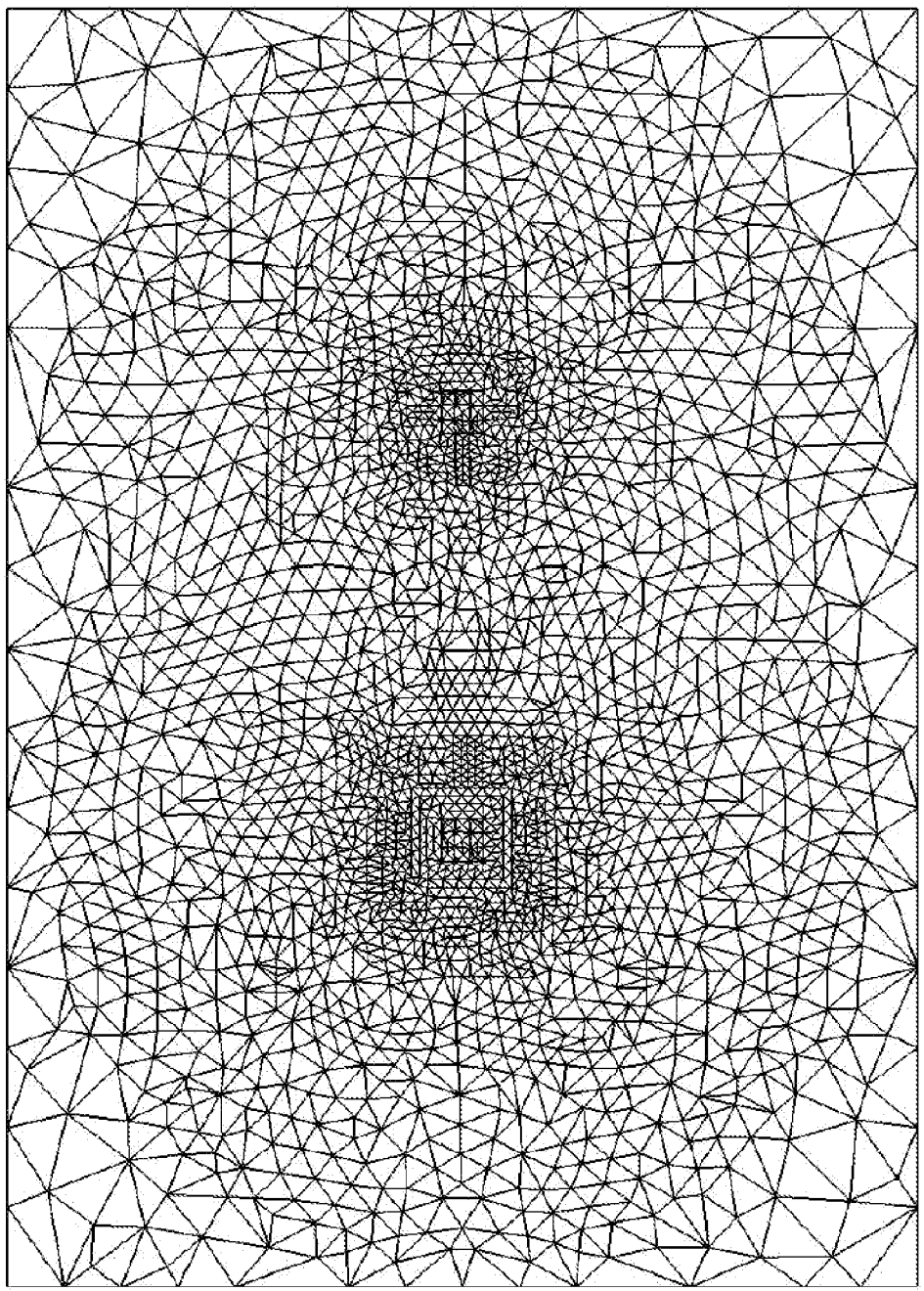
FIG. 12 illustrates a top view of a top layer of a mesh that represents the substrate illustrated in FIG. 10.

FIG. 12 illustrates a top layer of a mesh that represents the substrate illustrated in FIG. 10. The number of unknowns N is 107453 and the number of discretizations along the z direction is 15.

Figure 13:
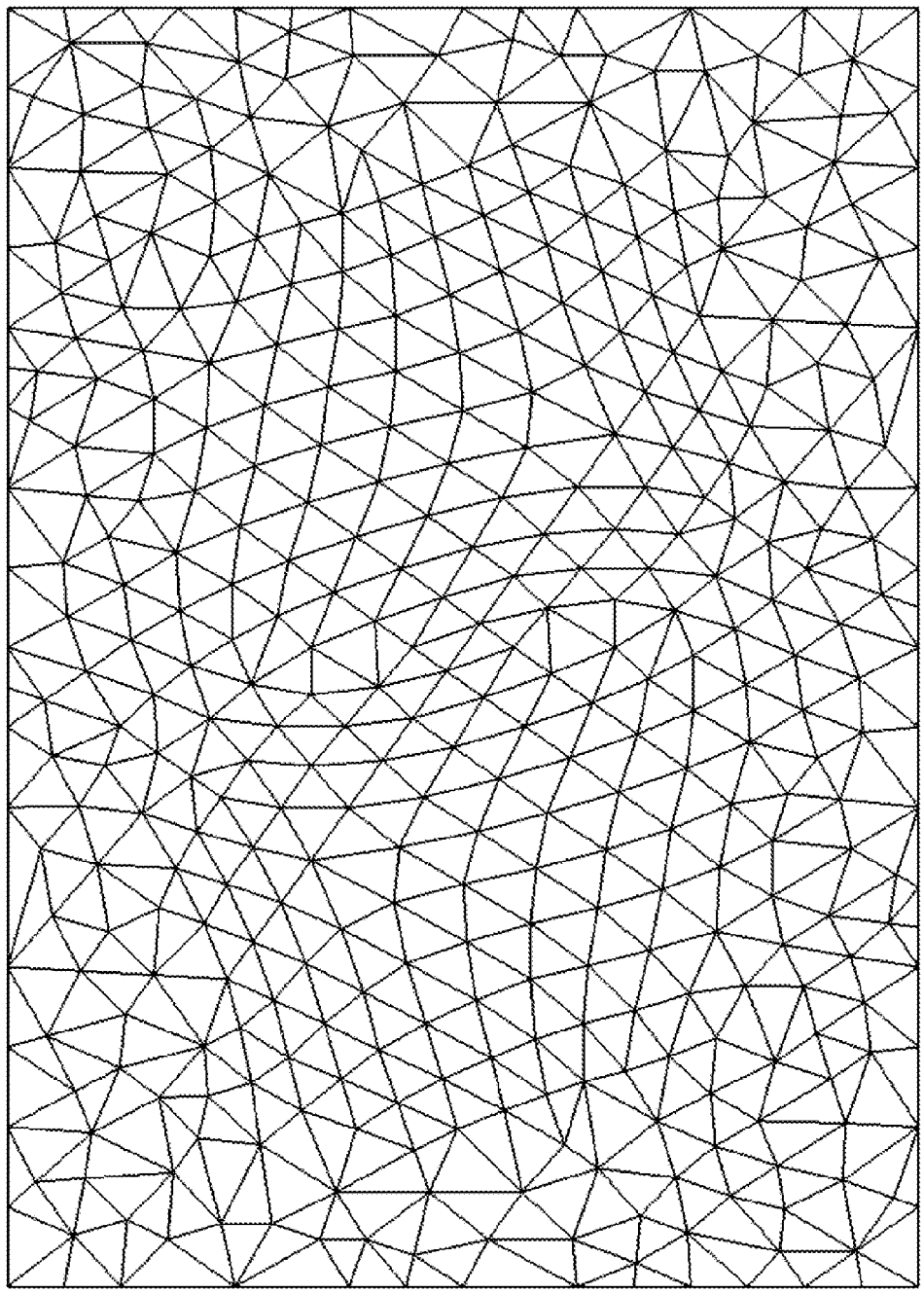
FIG. 13 illustrates a top view of a bottom layer of a mesh that represents the substrate illustrated in FIG. 10.

FIG. 13 illustrates a bottom surface of a mesh to represent the substrate illustrated in FIG. 10. The number of unknowns N and the number of discretizations along the z direction are same as in FIG. 12.

Tables 3 and 4 show that adaptive meshing with synchronization achieves the similar relative error of Y matrix or convergence in the x-y plane to the uniform meshing with less than half of the unknowns from uniform meshing with decreasing synchronization length. In Tables 5 and 6, although both adaptive and uniform meshing show the convergence in the z direction, the convergence of adaptive meshing deteriorates with non-decreasing maximum of synchronization length.

Total computation time and memory usage to obtain the admittance matrix Y between contacts are presented in Tables 7-10. Tables 7 and 9 are from adaptive meshing; Tables 8 and 10 are generated with uniform meshing for comparison with adaptive meshing. The unknown numbers and the numbers of non-zeros of the assembled matrix from adaptive meshing are less than half of the numbers from uniform meshing. Additionally, the memory cost of lower triangular matrix and upper triangular matrix factorization ("LU") inversion for adaptive meshing is three to four times less than uniform meshing.

Table 3 lists the numerical relative error of the admittance matrix Y and the resistance $R_{12}$ of the adaptive meshing along the z direction between two square contact ports on a substrate of size 300 μm×210 μm×300 μm having conductivity 10 (Sm$^{-1}$), as illustrated in FIGS. 10-13. The area constraints are varied along the x and y directions while keeping the same discretization number Nz of 15 along the z direction. An exact solution to compare with is generated by uniform meshing with contact triangle area tolerance of 6e-13 and Nz=15. The numbers of the triangles on the top surfaces are 327, 1299, 4444, and 20796 when contact area tolerances are 1e-10, 2e-11, 5e-12, and 1e-12, respectively. The resistance $R_{12}$ calculated by a commercially available field solver, e.g., HFSS from ANSOFT, is 2.950e4Ω.

TABLE 3

| Contact triangle area tolerance | The number of unknowns N | Maximum of synchronization length (μm) | Relative error of admittance matrix Y | $R_{12}$ (Ω) between two square contact ports |
|---|---|---|---|---|
| 1e-10 | 6989 | 2.9e-5 | 4.7e-1 | 2.868e4 |
| 2e-11 | 30239 | 2.1e-5 | 1.1e-1 | 3.063e4 |
| 5e-12 | 107453 | 9.5e-6 | 5.6e-2 | 2.930e4 |
| 1e-12 | 498865 | 5.5e-6 | 5.9e-3 | 2.963e4 |

Table 4 lists the numerical relative error of the admittance matrix Y and the resistance $R_{12}$ of uniform meshing along the z direction for the same example used to calculate the results in Table 3. The meshes on each layer are identical to the top meshes generated in Table 3. In addition, the other parameters are the same as in Table 3.

TABLE 4

| Contact triangle area tolerance | The number of unknowns N | Relative error of admittance matrix Y | $R_{12}$ (Ω) between two square contact ports |
|---|---|---|---|
| 1e-10 | 17352 | 3.4e-1 | 2.880e4 |
| 2e-11 | 69303 | 1.3e-1 | 2.958e4 |
| 5e-12 | 237465 | 4.8e-2 | 2.932e4 |
| 1e-12 | 1112415 | 4.5e-3 | 2.968e4 |

Table 5 lists the numerical relative error of the admittance matrix Y and the resistance $R_{12}$ of adaptive meshing along the z direction for the same example of Table 3. The discretization number Nz along the z direction is varied, while keeping the contact triangle area constrained as 5e-12 in x-y plane. An exact solution to compare with is generated by uniform meshing with Nz=160, where the approximate triangle areas on contacts controlled as 5e-12. The numbers of the triangles on the top surfaces are 4444 for all Nz. $R_{12}$ of HFSS is 2.950e4Ω.

TABLE 5

| Nz | The number of unknowns N | Maximum of synchronization length (μm) | Relative error of admittance matrix Y | $R_{12}$ (Ω) between two square contact ports |
|---|---|---|---|---|
| 10 | 76247 | 9.5e-6 | 3.1e-1 | 3.334e4 |
| 20 | 140192 | 8.8e-6 | 8.8e-2 | 2.888e4 |
| 40 | 269475 | 1.1e-5 | 4.8e-2 | 2.873e4 |
| 80 | 527355 | 1.1e-5 | 2.6e-2 | 2.887e4 |
| 120 | 785491 | 1.1e-5 | 7.8e-3 | 3.093e4 |

Table 6 lists the numerical relative error of the admittance matrix Y and the resistance $R_{12}$ of uniform meshing along the z direction for the same example of Table 5. The meshes on each layer are identical to the top meshes generated in Table 5. In addition, the other parameters are the same as the parameter used to generate Table 5.

TABLE 6

| Nz | The number of unknowns N | Relative error of admittance matrix Y | $R_{12}$ (Ω) between two square contact ports |
|---|---|---|---|
| 10 | 159840 | 3.1e-1 | 3.336e4 |
| 20 | 315090 | 7.9e-2 | 2.886e4 |
| 40 | 625590 | 3.8e-2 | 2.860e4 |
| 80 | 1246590 | 4.9e-3 | 2.863e4 |
| 120 | 1867590 | 1.2e-3 | 2.862e4 |

Table 7 lists the computation time to obtain the admittance matrix Y to generate Table 3 from the substrate example illustrated in FIGS. 10-13. For Table 7, a single central processing unit ("CPU") is used for matrix filling, and sixteen CPUs are used for matrix inversion. Contact area constraints are 1e-10, 2e-11, 5e-12 and 1e-12 while keeping Nz=15.

TABLE 7

| The number of unknowns N | Matrix filling time (s) | Matrix inversion time (s) | The number of non-zeros in the matrix set up | The number of non-zeros in L + U |
|---|---|---|---|---|
| 6989 | 0 | 0 | 35709 | 500249 |
| 30239 | 0 | 2 | 156531 | 3862737 |
| 107453 | 0 | 3 | 561572 | 19851091 |
| 498865 | 1 | 14 | 2606303 | 130069427 |

Table 8 lists the computation time to obtain the admittance matrix Y in generating Table 4 with uniform meshing along the z direction. In addition, the other parameters are same as the parameters used in Table 7.

TABLE 8

| The number of unknowns N | Matrix filling time (s) | Matrix inversion time (s) | The number of non-zeros in the matrix set up | The number of non-zeros in L + U |
|---|---|---|---|---|
| 17352 | 0 | 0 | 88560 | 2199654 |
| 69303 | 0 | 2 | 357363 | 15530689 |
| 237465 | 0 | 6 | 1227937 | 66914739 |
| 1112415 | 1 | 38 | 5759988 | 402536177 |

Table 9 lists the computation time to obtain the admittance matrix Y in generating Table 5 with adaptive meshing along the z direction. In this example, a single CPU is used for matrix filling, and sixteen CPUs are used for matrix inversion. Nz values are 10, 20, 40, 80, and 120, while keeping the contact triangle area tolerance as 5e-12.

TABLE 9

| The number of unknowns N | Matrix filling time (s) | Matrix inversion time (s) | The number of non-zeros in the matrix set up | The number of non-zeros in L + U |
|---|---|---|---|---|
| 76247 | 0 | 2 | 397058 | 10695503 |
| 140192 | 0 | 4 | 733930 | 31268094 |
| 269475 | 0 | 13 | 1414594 | 87742147 |
| 527355 | 1 | 40 | 2770028 | 255472197 |
| 785491 | 1 | 55 | 4126023 | 426990585 |

Table 10 lists the computation time to obtain the admittance matrix Y in generating Table 6 with uniform meshing along the z direction. The other parameters are same as the parameter for the example used in Table 9.

TABLE 10

| The number of unknowns N | Matrix filling time (s) | Matrix inversion time (s) | The number of non-zeros in the matrix set up | The number of non-zeros in L + U |
|---|---|---|---|---|
| 159840 | 0 | 4 | 818722 | 31286958 |
| 315090 | 0 | 11 | 1637152 | 103108954 |
| 625590 | 1 | 39 | 3274012 | 331863000 |
| 1246590 | 1 | 144 | 6547732 | 927325162 |
| 1867590 | 2 | 312 | 9821452 | 1588594646 | b. Second Substrate Example

Figure 14:
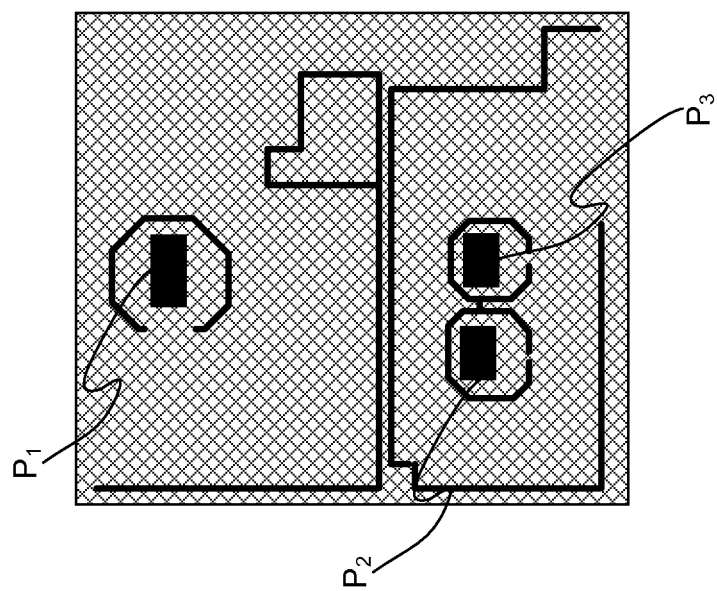
FIG. 14 illustrates a top view of a second substrate example.

FIG. 14 illustrates a top view of a second substrate example with eight ports. The size of the substrate is 4200 μm×4340 μm×300 μm. The substrate model has eight contact ports, where three of the contact ports are labeled as p1, p2, p3. The values of Table 11 are generated using adaptive meshing of the present invention, and uniform meshing is used to generate the values of Table 12 for comparison. The resistances between p1 and p2 and between p2 and p3 ports are computed and listed in the last two columns of Tables 11 and 12. Computation time and memory usage are listed in Tables 13 and 14 for the adaptive and uniform meshing, respectively. Suitable parameters are chosen via empirical convergence tests. Triangle numbers for each layer are 47134, 47134, 43828, 43026, 40702, 27264, 17654, 14810, 12212, 9920, 9920, 9920, 9920, 9920, and 9920 for adaptive meshing for the second row in Table 11 when the contact triangle area constraint is 1e-10. Uniform meshing has 47134 triangles for each layer that is identical to the top meshing from adaptive meshing.

The resistance values are 1~3% different between adaptive and uniform meshing when the contact area constraint is equal to 1e-10. As the contact triangle area constraint becomes 5e-11, the difference decreases to 1~1.5%. For the same contact triangle area constraint, memory and time costs for generating an adaptive mesh to represent the second substrate example are at least two times less than the memory and time costs for generating a uniform mesh. When the substrate thickness gets larger, more time and memory advantages can be expected with the synchronization method of the present invention.

Table 11 lists the numerical relative error of the admittance matrix Y and the resistance $R_{23}$ with adaptive meshing along the z direction between two square contact ports on substrate of size 4200 μm×4340 μm×300 μm of conductivity 7.4 (Sm⁻). The area constraints are varied along the x and y directions while keeping the same discretization number Nz of 14 along the z direction. The resistance $R_{ij}$ can be defined to be the resistance between ports pi and pj.

TABLE 11

| Contact triangle area | The number of unknowns N | Maximum of synchronization length (μm) | $R_{12}$ (Ω) between two square contact ports | $R_{23}$ (Ω) between two square contact ports |
|---|---|---|---|---|
| 1e−10 | 1125341 | 6.1e−5 | 4.703e4 | 5.157e3 |
| 5e−11 | 2219544 | 4.2e−5 | 4.803e4 | 5.275e3 |

Table 12 lists the numerical relative error of the admittance matrix Y and the resistance $R_{23}$ of uniform meshing along the z direction for the same example of Table 11. The mesh configuration for each layer is identical to the top meshes used to generate the values in Table 5. The other parameters are the same parameters used in generating the values listed in Table 11.

TABLE 12

| Contact triangle area | The number of unknowns N | $R_{12}$ (Ω) between two square contact ports | $R_{23}$ (Ω) between two square contact ports |
|---|---|---|---|
| 1e−10 | 2363590 | 4.744e4 | 5.299e3 |
| 5e−11 | 4627723 | 4.842e4 | 5.346e3 |

Table 13 lists the computation time to obtain the admittance matrix Y on the second substrate example for generating the values in Table 11 with adaptive meshing along the z direction. A single CPU is used for matrix filling and sixteen CPUs are used for matrix inversion. The contact area constraints are 1e-10 and 5e-11, while keeping Nz=14.

TABLE 13

| The number of unknowns N | Matrix filling time (s) | Matrix inversion time (s) | The number of non-zeros in the matrix set up | The number of non-zeros in L + U |
|---|---|---|---|---|
| 1125341 | 3 | 112 | 5862338 | 241929893 |
| 2219544 | 5 | 265 | 11543488 | 605439946 |

Table 14 lists the computation time to obtain the admittance matrix to generate Table 12 with uniform meshing along the z direction. The other parameters are same as the parameters used to generate Table 13.

TABLE 14

| The number of unknowns N | Matrix filling time (s) | Matrix inversion time (s) | The number of non-zeros in the matrix set up | The number of non-zeros in L + U |
|---|---|---|---|---|
| 2363590 | 5 | 247 | 12205316 | 665398950 |
| 4627723 | 9 | 577 | 23905284 | 1483937069 |

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

We claim:

1. A simulation method executed on a computing device for simulating a three-dimensional structure, such that two-dimensional layered meshing models three-dimensional current flow, comprising the steps of:
    discretizing the three-dimensional structure into two-dimensional ("2-D") layers, such that each of the 2-D layers having mesh nodes, such that the mesh nodes for a certain one of the 2-D layers and the respective mesh nodes of one or more other ones of the 2-D layers are non-connectable by perpendicular lines through the 2-D layers, and such that the 2-D layers have varied meshing densities to capture current distribution utilizing adaptive meshing;

constructing a two-dimensional basis for each of the 2-D layers; and constructing a one-dimensional finite difference basis between the 2-D layers, such that a synchronization voltage difference between points that span across adjacent layers of the 2-D layers is determined, such that the points are connected, and such that the connected points have different voltage values.

2. The method of claim 1 wherein the two-dimensional basis is a finite element basis.

3. The method of claim 1 wherein the two-dimensional basis is a finite difference basis.

4. The method of claim 1 wherein a first layer of the 2-D layers has a first panel with a first point and a second layer of the 2-D layers has a second panel with a second point, wherein the first point and the second point are vertically connected and the vertical connection is perpendicular to the first panel and the second panel, and wherein the one-dimensional finite difference basis uses a synchronization method to determine a synchronization voltage difference between the first point and the second point.

5. The method of claim 4 wherein the synchronization method comprises the steps of:

determining a centroid voltage difference between respective centroids of the first panel and the second panel;

determining a correction voltage, wherein the correction voltage is the voltage difference between the first point and the centroid of the first panel; and determining the synchronization voltage difference based on the centroid voltage difference and the correction voltage, wherein at least one one-dimensional line integral is used to determine the synchronization voltage difference.

6. The method of claim 4 wherein the first point is not the centroid of the first panel and wherein the second point is the centroid of the second panel.

7. The method of claim 4 wherein the vertical connection is a via.

8. The method of claim 1 wherein the discretized 2-D layers are adaptively meshed and wherein the discretized 2-D layers have a varied number of triangular areas for the 2-D layers.

9. The method of claim 1 wherein the three-dimensional structure is an integrated circuit substrate.

10. The method of claim 1 wherein the two-dimensional basis is a Rao-Wilton-Glisson ("RWG") basis.

11. The method of claim 1 wherein the one-dimensional finite difference basis is a pulse basis.

12. The method of claim 8 wherein the adaptive mesh of the discretized 2-D layers is a resistive and inductive mesh.

13. The method of claim 4 wherein the synchronization voltage difference is given by:

$$R_4 I_4 + jw \sum_j L_{4,j} I_j = (V_2 - V_4) + (V_{M+} - V_2) - (V_{M-} - V_4),$$

where $R_4$ is a resistance value of the vertical connection, $I_4$ is a current value of the vertical connection, w is a frequency, j is an imaginary unit, $L_4$ is an inductance value of the vertical connection, $L_{4,j}$ is an inductance matrix, and $I_j$ is a current matrix, $V_{M+}$ is the voltage at the first point, and $V_{M-}$ is the voltage at the second point, wherein $$R_4 I_4 + jw \sum_j L_{4,j} I_j$$

is the synchronization voltage difference, $(V_2-V_4)$ is a centroid voltage difference, $(V_{M+}-V_2)$ and $(V_{M-}-V_4)$ are correction voltages, and wherein $V_2$ is a voltage at a first centroid and $V_4$ is a voltage at a second centroid.

14. The method of claim 5 wherein the correction voltage is given by $$\phi(C_s) - \phi(M_s) = -\int_{C_s}^{M_s} \nabla \phi(r) \cdot dl = \int_{C_s}^{M_s} \left[ \frac{\vec{J}(r)}{\sigma} + jw \int_V G_A(r, r') \vec{J}(r') \right] \cdot dl$$

where $C_s$ is a coordinate of the centroid of the first panel, $M_s$ is a coordinate of the first point, $\phi(C_s)$ is an electric potential at the centroid of the first panel, $\phi(M_s)$ is an electric potential at the first point, $\vec{J}(r)$ is a current density function, $\sigma$ is an electrical conductivity, w is a frequency, j is an imaginary unit, and $G_A(r,r')$ is a Green's function that characterizes the vector potential response at position r due to a current dipole excitation at r'.

15. The method of claim 1 wherein the two-dimensional basis is an integral equation based basis from an integral equation in three dimensions.

16. A simulation method executed on a computing device for simulating a three-dimensional structure, such that two-dimensional layered meshing models three-dimensional current flow comprising the steps of:

discretizing the three-dimensional structure into two-dimensional ("2-D") layers, such that each of the 2-D layers having mesh nodes, such that the mesh nodes for a certain one of the 2-D layers and the respective mesh nodes of one or more other ones of the 2-D layers are non-connectable by perpendicular lines through the 2-D layers, and such that the 2-D layers have varied meshing densities to capture current distribution utilizing adaptive meshing; constructing a two-dimensional basis for each of the 2-D layers; and constructing a one-dimensional finite difference basis between the 2-D layers, wherein such that a synchronization voltage difference between points that span across adjacent layers of the 2-D layers is determined, such that a first layer of the 2-D layers has a first panel with a first point and a second layer of the 2-D layers has a second panel with a second point, such that the first point and the second point are vertically connected by a via and the vertical connection is perpendicular to the first panel and the second panel, such that the one-dimensional finite difference basis uses a synchronization method to determine a synchronization voltage difference between the first point and the second point, such that the constructed two-dimensional basis for each of the 2-D layers and the constructed one-dimensional finite difference basis between the 2-D layers form a layered and adaptive mesh, and such that the first point and the second point have different voltage values.

17. The method of claim 16 wherein the synchronization method comprises the steps of:
- determining a centroid voltage difference between respective centroids of the first panel and the second panel;
- determining a first correction voltage, wherein the first correction voltage is the voltage difference between the first point and the centroid of the first panel;
- determining a second correction voltage, wherein the second correction voltage is the voltage difference between the second point and the centroid of the second panel; and
- determining the synchronization voltage difference based on the centroid voltage difference, the first correction voltage, and the second correction voltage,
- wherein at least one one-dimensional line integral is used to determine the synchronization voltage difference.

18. A simulation method executed on a computing device for simulating a three-dimensional structure, such that two-dimensional layered meshing models three-dimensional current flow, comprising the steps of:
- discretizing the three-dimensional structure into two-dimensional ("2-D") layers, such that each of the 2-D layers having mesh nodes, such that the mesh nodes for a certain one of the 2-D layers and the respective mesh nodes of one or more other ones of the 2-D layers are non-connectable by perpendicular lines through the 2-D layers, such that the 2-D layers have varied meshing densities to capture current distribution, and such that the discretized 2-D layers are adaptively meshed;
- constructing a two-dimensional Rao-Wilton-Glisson basis for each of the 2-D layers; and
- constructing a one-dimensional pulse basis between the 2-D layers,
- such that a synchronization voltage difference between points that span across adjacent layers of the 2-D layers is determined,
- such that at least one one-dimensional line integral is used to determine the synchronization voltage difference,
- such that a first layer of the 2-D layers has a first panel with a first point and a second layer of the 2-D layers has a second panel with a second point,
- such that the first point and the second point have different voltage values,
- such that the first point and the second point are vertically connected by a via and the vertical connection is perpendicular to the first panel and the second panel,
- such that the one-dimensional finite difference basis uses a synchronization method to determine a synchronization voltage difference between the first point and the second point,
- such that the synchronization method comprises the steps of:
  - determining a centroid voltage difference between respective centroids of the first panel and the second panel;
  - determining a first correction voltage, such that the first correction voltage is the voltage difference between the first point and the centroid of the first panel;
  - determining a second correction voltage, such that the second correction voltage is the voltage difference between the second point and the centroid of the second panel; and
  - determining the synchronization voltage difference based on the centroid voltage difference, the first correction voltage, and the second correction voltage such that the synchronization voltage difference is given by:

$$R_4 I_4 + jw \sum_j L_{4,j} I_j = (V_2 - V_4) + (V_{M+} - V_2) - (V_{M-} - V_4),$$

where $R_4$ is a resistance value of the vertical connection, $I_4$ is a current value of the vertical connection, w is a frequency, j is an imaginary unit, $L_4$ is an inductance value of the vertical connection, $L_{4,j}$ is an inductance matrix, and $I_j$ is a current matrix, $V_{M+}$ is the voltage at the first point, and $V_{M-}$ is the voltage at the second point, such that $$R_4 I_4 + jw \sum_j L_{4,j} I_j$$

is the synchronization voltage difference, $(V_2-V_4)$ is a centroid voltage difference, $(V_{M+}-V_2)$ and $(V_{M-}-V_4)$ are correction voltages, and
such that $V_2$ is a voltage at a first centroid and $V_4$ is a voltage at a second centroid.

19. The method of claim 18 wherein the first point is not the centroid of the first panel and wherein the second point is not the centroid of the second panel.

* * * * *